United States Patent
Chen

(10) Patent No.: US 9,188,608 B2
(45) Date of Patent: Nov. 17, 2015

(54) ANALYSIS METHOD FOR SIGNAL TIME MARGIN

(71) Applicants: Inventec (Pudong) Technology Corporation, Shanghai (CN); INVENTEC CORPORATION, Taipei (TW)

(72) Inventor: Yen-Hao Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 494 days.

(21) Appl. No.: 13/791,147

(22) Filed: Mar. 8, 2013

(65) Prior Publication Data

US 2014/0117973 A1  May 1, 2014

(30) Foreign Application Priority Data

Oct. 25, 2012  (CN) .......................... 2012 1 0414739

(51) Int. Cl.
*G01R 23/16* (2006.01)
*G01R 13/02* (2006.01)
*G01R 31/317* (2006.01)

(52) U.S. Cl.
CPC ...... *G01R 13/0209* (2013.01); *G01R 31/31726* (2013.01); *G01R 31/31727* (2013.01)

(58) Field of Classification Search
CPC .................. G01R 31/31726; G01R 31/31727; G01R 13/209
USPC .................................. 324/6.12, 76.39, 76.77
See application file for complete search history.

(56) References Cited

U.S. PATENT DOCUMENTS

| | | | |
|---|---|---|---|
| 7,187,448 B2* | 3/2007 | Lehureau ............. | G01C 19/726 356/464 |
| 8,477,834 B2* | 7/2013 | Leibowitz ......... | H04L 25/03057 375/233 |
| 2009/0060022 A1* | 3/2009 | Dhar ................. | H04L 25/03057 375/233 |

* cited by examiner

*Primary Examiner* — Tung X Nguyen
*Assistant Examiner* — Dominic Hawkins
(74) *Attorney, Agent, or Firm* — Locke Lord LLP; Tim Tingkang Xia, Esq.

(57) ABSTRACT

An analysis method for a signal time margin is provided. An input signal is received. The input signal is extracted to obtain a primary waveform, at least one first secondary waveform and at least one second secondary waveform of the input signal. The first secondary waveform and the second secondary waveform are respectively located before and after the primary waveform. Quantities of the first secondary waveform and the second secondary waveform are counted to respectively generate a first quantity and a second quantity. According to the first quantity, the primary waveform and the first secondary waveform, first bit combinations are generated, and according to the second quantity, the primary waveform and the second secondary waveform, second bit combinations are generated. The first and second bit combinations are integrated to generate third bit combinations. Signal analysis is performed on the third bit combinations to obtain a signal time margin.

5 Claims, 2 Drawing Sheets

ANALYSIS METHOD FOR SIGNAL TIME MARGIN

CROSS-REFERENCE TO RELATED APPLICATIONS

This non-provisional application claims priority under 35 U.S.C. §119(a) on Patent Application No(s). 201210414739.8 filed in China on Oct. 25, 2012, the entire contents of which are hereby incorporated by reference.

BACKGROUND

1. Technical Field

The disclosure relates to an analysis method for a signal, and more particularly to an analysis method for a signal time margin.

2. Related Art

Generally, in a digital circuit, a clock signal has to latch data on a signal line in a specific time period, so as to perform corresponding processing. The specific time period is generally defined as a setup time margin and a hold time margin.

Along with the ever increasing clock speed of the digital signal, an Inter Symbol Interference (ISI) phenomenon caused by signal reflection and loss becomes more and more obvious. When different bit combinations are transmitted on the signal line, different waveform distortions are caused more seriously. Therefore, setup time margins and hold time margins calculated according to different bit cycles are different, that is, different data bits have their setup time margins and hold time margins, so that it is harder and harder to estimate the minimum setup time margin and the minimum hold time margin of the signal.

In order to obtain the minimum setup time margin and the minimum hold time margin so as to ensure the completeness and reliability of the product design, a large quantity of data bits are used in signal simulation software in a conventional manner. However, this conventional manner requires a lot of time to simulate various data bit combinations, and is also unable to find out the minimum setup time margin and the minimum hold time margin. Therefore, the analysis method for the setup time margin and the hold time margin is necessary to be improved.

SUMMARY

An analysis method for a signal time margin of the disclosure comprises the following steps. An input signal is received. The input signal is extracted, so as to obtain a primary waveform, at least one first secondary waveform and at least one second secondary waveform of the input signal. The at least one first secondary waveform is located before the primary waveform, and the at least one second secondary waveform is located after the primary waveform. A quantity of the at least one first secondary waveform is counted, so as to generate a first quantity. A quantity of the at least one second secondary waveform is counted, so as to generate a second quantity. According to the first quantity, the primary waveform and the at least one first secondary waveform, first bit combinations are generated. According to the second quantity, the primary waveform and the at least one second secondary waveform, second bit combinations are generated. The first bit combinations and the second bit combinations are integrated, so as to generate third bit combinations. Signal analysis is performed on the third bit combinations, so as to obtain a signal time margin.

In an embodiment, the input signal comprises a pulse signal or a step signal.

In an embodiment, the signal time margin comprises a setup time margin or a hold time margin.

In an embodiment, the step of performing signal analysis on the third bit combination to obtain the signal time margin comprises the following steps. When it is required to analyze a rising edge of the primary waveform, a quantity of the third bit combinations is divided by two. Signal analysis is performed on the third bit combinations with the quantity divided by two, so as to obtain the signal time margin.

In an embodiment, the step of performing signal analysis on the third bit combination to obtain the signal time margin comprises the following steps. When it is required to analyze a falling edge of the primary waveform, a quantity of the third bit combinations is divided by two. Signal analysis is performed on the third bit combinations with the quantity divided by two, so as to obtain the signal time margin.

For purposes of summarizing, some aspects, advantages and features of some embodiments of the disclosure have been described in this summary. Not necessarily all of (or any of) these summarized aspects, advantages or features will be embodied in any particular embodiment of the disclosure. Some of these summarized aspects, advantages and features and other aspects, advantages and features may become more fully apparent from the following detailed description and the appended claims.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The detailed features and advantages of the disclosure are described below in great detail through the following embodiments, the content of which is sufficient for those skilled in the art to understand the technical content of the disclosure and to implement the disclosure accordingly. Based on the content of the specification, the claims, and the drawings, those skilled in the art can easily understand the relevant objectives and advantages of the disclosure.

Figure 1:
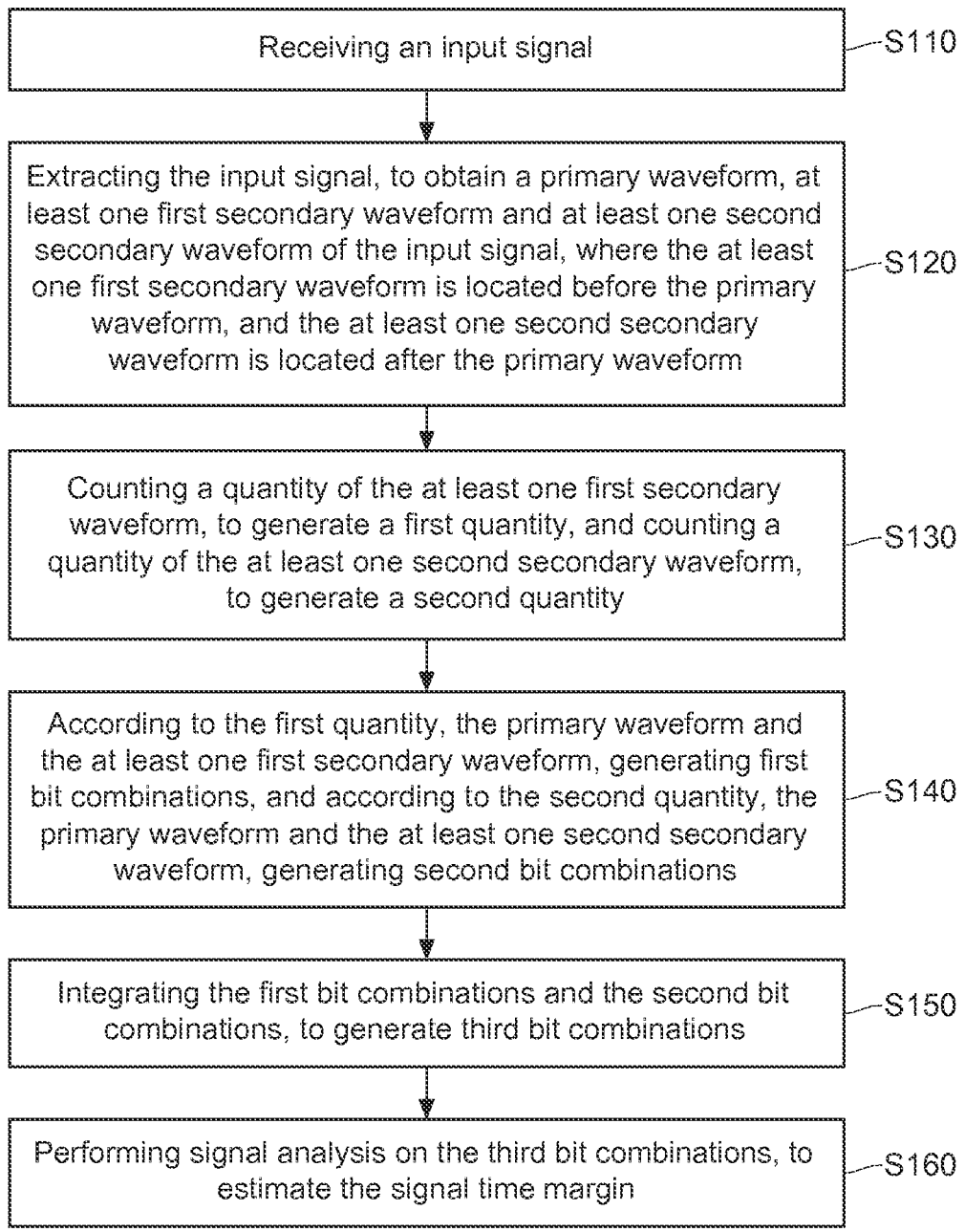
FIG. 1 is a flow chart of an analysis method for a signal time margin of the disclosure.

Referring to FIG. 1, a flow chart of an analysis method for a signal time margin of the disclosure is shown. The analysis method for a signal time margin of this embodiment is applicable to a signal analysis device, and the signal analysis device analyzes an input signal. In Step S110, the input signal is received. The signal analysis device receives the input signal which is generated by, for example, a digital circuit.

Figure 2:
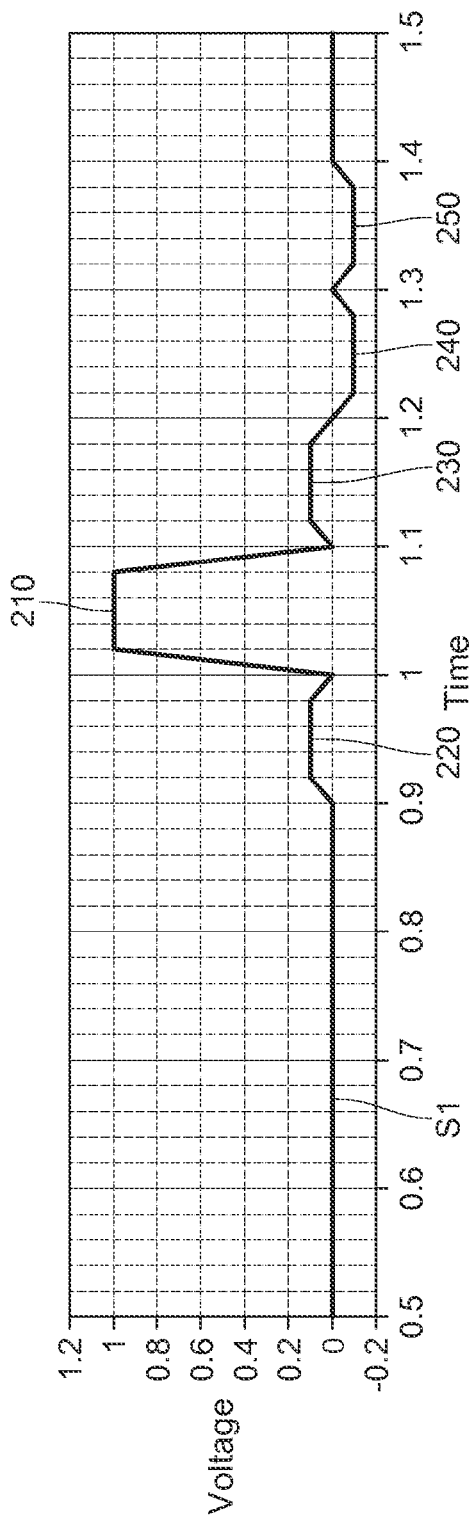
FIG. 2 is a waveform diagram of an input signal of the disclosure.

In an embodiment, the input signal is a pulse signal S1 as shown in FIG. 2, where the label 210 indicates a primary waveform of the pulse signal S1, the label 220 indicates a first secondary waveform of the pulse signal S1, and the labels 230, 240 and 250 respectively indicate second secondary waveforms of the pulse signal S1.

Figure 3:
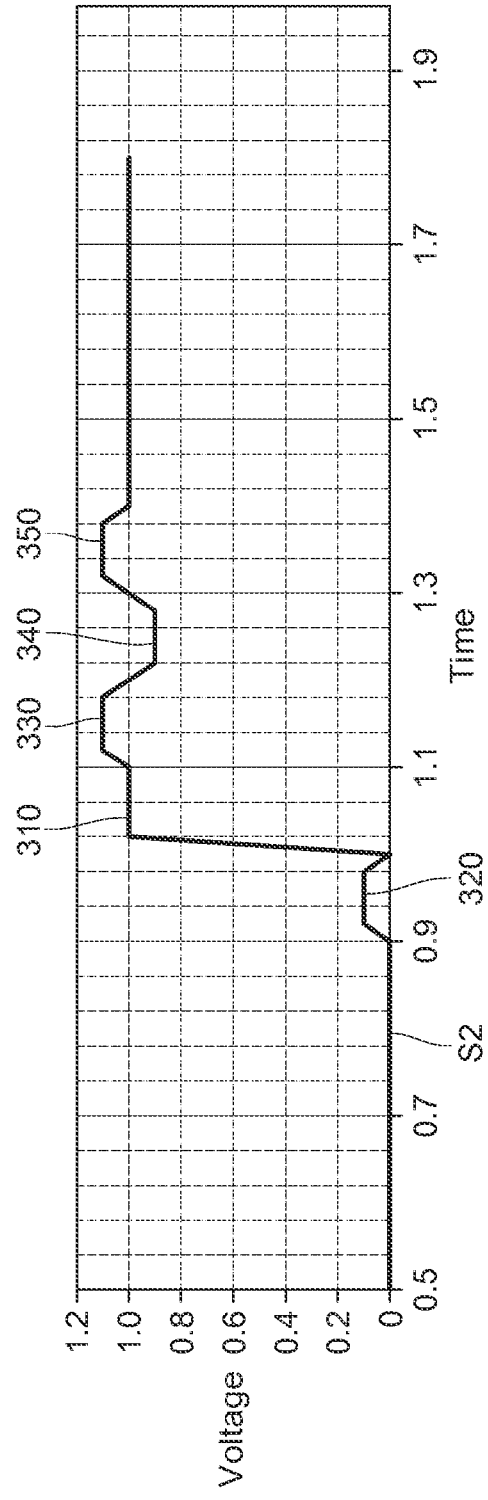
FIG. 3 is a waveform diagram of another input signal of the disclosure.

In another embodiment, the input signal is a step signal S2 as shown in FIG. 3, where the label 310 indicates a primary waveform of the step signal S2, the label 320 indicates a first secondary waveform of the step signal S2, and the labels 330, 340 and 350 respectively indicate second secondary waveforms of the step signal S2.

In Step S120, the input signal is extracted, so as to obtain the primary waveform, the at least one first secondary waveform and the at least one second secondary waveform of the input signal, where the at least one first secondary waveform is located before the primary waveform, and the at least one second secondary waveform is located after the primary waveform. In this embodiment, after the signal analysis device receives the input signal, the signal analysis device considers the waveform having variation before the occurrence of the primary waveform, as the first secondary waveform, and considers the waveform having variation after the occurrence of the primary waveform, as the second secondary waveform, so as to obtain the primary waveform, the first secondary waveform and the second secondary waveform of the input signal.

In the embodiment of the input signal as the pulse signal S1, the signal analysis device correspondingly obtains a primary waveform 210, a first secondary waveform 220 and second secondary waveforms 230, 240 and 250. In the embodiment of the input signal as the step signal S2, the signal analysis device correspondingly obtains a primary waveform 310, a first secondary waveform 320 and second secondary waveforms 330, 340 and 350.

In Step S130, a quantity of the at least one first secondary waveform is counted, so as to generate a first quantity, and a quantity of the at least one second secondary waveform is counted, so as to generate a second quantity. The input signal includes the first secondary waveform 220 (in the pulse signal S1) or the first secondary waveform 320 (in the step signal S2), so the signal analysis device counts the first secondary waveform 220 or 320, and generates the first quantity of "1". Moreover, the input signal includes the second secondary waveforms 230, 240 and 250 (in the pulse signal S1) or the second secondary waveforms 330, 340 and 350 (in the step signal S2), so the signal analysis device counts the second secondary waveforms, and generates the second quantity of "3".

In Step S140, according to the first quantity, the primary waveform and the at least one first secondary waveform, first bit combinations are generated, and according to the second quantity, the primary waveform and the at least one second secondary waveform, second bit combinations are generated. In this and some other embodiments, a bit of the first secondary waveform 220 (320) is "0" or "1", and the first quantity corresponding to the first secondary waveform 220 (320) is "1", so that the signal analysis device, according to the first quantity of "1", the primary waveform 210 (310) and the first secondary waveform 220 (320), correspondingly generates two first bit combinations as shown in Table 1.

In addition, in this and some other embodiments, bits of the second secondary waveforms 230, 240 and 250 (330, 340 and 350) are also "0" or "1", and the second quantity corresponding to the second secondary waveforms 230, 240 and 250 (330, 340 and 350) is "3", so that the signal analysis device, according to the second quantity of "3", the primary waveform 210 (310) and the second secondary waveforms 230, 240 and 250 (330, 340 and 350), correspondingly generates eight second bit combinations as shown in Table 2. As set forth above, the quantity of the first bit combinations is $2^N$, and the quantity of the second bit combinations is $2^M$, where N is the first quantity, and M is the second quantity.

TABLE 1

First bit combinations of the disclosure

| bit combination | Bit of the primary waveform 210 (310) | Bit of the first secondary waveform 220 (320) |
|---|---|---|
| 1 | 1 | 0 |
| 2 | 1 | 1 |

TABLE 2

Second bit combinations of the disclosure

| bit combination | Bit of the second secondary waveform 250 (350) | Bit of the second secondary waveform 240 (340) | Bit of the second secondary waveform 230 (330) | Bit of the primary waveform 210 (310) |
|---|---|---|---|---|
| 1 | 0 | 0 | 0 | 1 |
| 2 | 0 | 0 | 1 | 1 |
| 3 | 0 | 1 | 0 | 1 |
| 4 | 0 | 1 | 1 | 1 |
| 5 | 1 | 0 | 0 | 1 |
| 6 | 1 | 0 | 1 | 1 |
| 7 | 1 | 1 | 0 | 1 |
| 8 | 1 | 1 | 1 | 1 |

In Step S150, the first bit combinations and the second bit combinations are integrated, so as to generate third bit combinations. After the signal analysis device generates the first bit combinations and the second bit combinations, the signal analysis device integrates the first bit combinations and the second bit combinations, so as to generate the third bit combinations, which comprises all bit combinations of the primary waveform 210 (310), the first secondary waveform 220 (320) and the second secondary waveforms 230, 240 and 250 (330, 340 and 350), as shown in Table 3.

TABLE 3

Third bit combinations of the disclosure

| bit combination | Bit of the second secondary waveform 250 (350) | Bit of the second secondary waveform 240 (340) | Bit of the second secondary waveform 230 (330) | Bit of the primary waveform 210 (310) | Bit of the first secondary waveform 220 (320) |
|---|---|---|---|---|---|
| 1 | 0 | 0 | 0 | 1 | 0 |
| 2 | 0 | 0 | 1 | 1 | 0 |
| 3 | 0 | 1 | 0 | 1 | 0 |
| 4 | 0 | 1 | 1 | 1 | 0 |
| 5 | 1 | 0 | 0 | 1 | 0 |
| 6 | 1 | 0 | 1 | 1 | 0 |
| 7 | 1 | 1 | 0 | 1 | 0 |
| 8 | 1 | 1 | 1 | 1 | 0 |
| 9 | 0 | 0 | 0 | 1 | 1 |
| 10 | 0 | 0 | 1 | 1 | 1 |
| 11 | 0 | 1 | 0 | 1 | 1 |
| 12 | 0 | 1 | 1 | 1 | 1 |
| 13 | 1 | 0 | 0 | 1 | 1 |
| 14 | 1 | 0 | 1 | 1 | 1 |
| 15 | 1 | 1 | 0 | 1 | 1 |
| 16 | 1 | 1 | 1 | 1 | 1 |

In Step S160, signal analysis is performed on the third bit combinations, so as to obtain a signal time margin. In other words, the signal analysis device uses the third bit combinations at the transition of the primary waveform 210 (310) to find out the bit combination corresponding the waveform that exceeds a specific voltage with the highest speed, and to find out the bit combination corresponding the waveform that exceeds the specific voltage with the lowest speed, so as to find out a minimum signal time margin. In this embodiment, the signal time margin comprises a setup time margin or a hold time margin. Therefore, in this and some other embodiments, the analysis speed and efficiency of the signal time margin may be increased effectively, and the minimum signal time margin is found out.

In an embodiment, Step S160 comprises the following steps. When it is required to analyze a rising edge of the primary waveform 210 (310), the quantity of the third bit combinations is divided by two. Specifically, the rising edge of the primary waveform 210 (310) is analyzed, so the bit of the first one (that is, 230 or 330) of the second secondary waveforms is "0", and the signal analysis device deletes the second combination having the bit of the first one (that is, 230 or 330) of the second secondary waveforms being "1", that is, divides the quantity of the third bit combinations by two, that is, 16/2=8.

Subsequently, the signal analysis device performs signal analysis on the third bit combinations with the quantity being divided by two (for example, 8), that is, performs the signal analysis on the eight third bit combinations shown in Table 4, so as to obtain the signal time margin. Therefore, the quantity of the bit combinations is reduced, so that the analysis speed and efficiency of the signal time margin may be effectively increased.

TABLE 4

Third bit combinations of the disclosure

| bit combination | Bit of the second secondary waveform 250 (350) | Bit of the second secondary waveform 240 (340) | Bit of the second secondary waveform 230 (330) | Bit of the primary waveform 210 (310) | Bit of the first secondary waveform 220 (320) |
|---|---|---|---|---|---|
| 1 | 0 | 0 | 0 | 1 | 0 |
| 2 | 0 | 1 | 0 | 1 | 0 |
| 3 | 1 | 0 | 0 | 1 | 0 |
| 4 | 1 | 1 | 0 | 1 | 0 |
| 5 | 0 | 0 | 0 | 1 | 1 |
| 6 | 0 | 1 | 0 | 1 | 1 |
| 7 | 1 | 0 | 0 | 1 | 1 |
| 8 | 1 | 1 | 0 | 1 | 1 |

In another embodiment, Step 160 comprises the following steps. When it is required to analyze a falling edge of the primary waveform 210 (310), the quantity of the third bit combinations is divided by two. Specifically, the falling edge of the primary waveform 210 (310) is analyzed, so the bit of the first one (that is, 220 or 320) of the first secondary waveform is "0". The signal analysis device deletes the second combination having the bit of the first one (that is, 220 or 320) of the first secondary waveform being "1", that is, divides the quantity of the third bit combinations by two, that is, 16/2=8.

Subsequently, the signal analysis device performs signal analysis on the third bit combinations with the quantity divided by two (for example, 8), that is, performs the signal analysis on the eight third bit combinations shown in Table 5, so as to obtain the signal time margin. Therefore, the quantity of the bit combinations is reduced, so that the analysis speed and efficiency of the signal time margin may be effectively increased.

TABLE 5

Third bit combinations of the disclosure

| bit combination | Bit of the second secondary waveform 250 (350) | Bit of the second secondary waveform 240 (340) | Bit of the second secondary waveform 230 (330) | Bit of the primary waveform 210 (310) | Bit of the first secondary waveform 220 (320) |
|---|---|---|---|---|---|
| 1 | 0 | 0 | 0 | 1 | 0 |
| 2 | 0 | 0 | 1 | 1 | 0 |
| 3 | 0 | 1 | 0 | 1 | 0 |
| 4 | 0 | 1 | 1 | 1 | 0 |
| 5 | 1 | 0 | 0 | 1 | 0 |
| 6 | 1 | 0 | 1 | 1 | 0 |
| 7 | 1 | 1 | 0 | 1 | 0 |
| 8 | 1 | 1 | 1 | 1 | 0 |

In the above embodiments, the quantity of the first secondary waveform is, for example, one, and the quantity of the second secondary waveforms is, for example, three. However, the disclosure is not limited thereto, in this and some other embodiments, the quantity of the first secondary waveform is two or more than two, and the quantity of the second secondary waveform is one, two, three or more than three. Implementations of the first secondary waveforms and the second secondary waveforms with different quantities may be deduced by those skilled in the art with reference to the foregoing description, and are not repeated herein.

In the analysis method for the signal time margin according to the embodiments of the disclosure, the primary waveform, the at least one first secondary waveform and the at least one second secondary waveform of the input signal are obtained, quantities of the at least one first secondary waveform and the at least one second secondary waveform are counted, the first bit combinations and the second bit combinations are generated according to the primary waveform and the quantities of the at least one first secondary waveform and the at least one second secondary waveform, the first bit combinations and the second bit combinations are then integrated to form the third bit combinations, and signal analysis is performed on the third bit combinations, thereby obtaining the signal time margin. In addition, in this and some other embodiments, by analyzing the rising edge or falling edge of the primary waveform, the quantity of the third bit combinations is halved, and then the signal analysis is performed on the third bit combinations with the halved quantity. Therefore, the analysis efficiency of the signal time margin may be effectively increased, and the minimum signal time margin is found out.

The disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An analysis method for a signal time margin, comprising:
  receiving an input signal;
  extracting the input signal to obtain a primary waveform, at least one first secondary waveform and at least one second secondary waveform of the input signal, the at least one first secondary waveform located before the primary waveform, and the at least one second secondary waveform located after the primary waveform;

counting a quantity of the at least one first secondary waveform to generate a first quantity, and counting a quantity of the at least one second secondary waveform to generate a second quantity;

according to the first quantity, the primary waveform and the at least one first secondary waveform, generating first bit combinations, and according to the second quantity, the primary waveform and the at least one second secondary waveform, generating second bit combinations;

integrating the first bit combinations and the second bit combinations to generate third bit combinations; and performing signal analysis on the third bit combinations to obtain the signal time margin.

2. The analysis method for the signal time margin according to claim 1, wherein the input signal is a pulse signal or a step signal.

3. The analysis method for the signal time margin according to claim 1, wherein the signal time margin is a setup time margin or a hold time margin.

4. The analysis method for the signal time margin according to claim 1, wherein the step of counting the third bit combinations to obtain the signal time margin comprises:

when it is required to analyze a rising edge of the primary waveform, dividing a quantity of the third bit combinations by two; and performing the signal analysis on the third bit combinations with the quantity divided by two, so as to obtain the signal time margin.

5. The analysis method for the signal time margin according to claim 1, wherein the step of counting the third bit combinations to obtain the signal time margin comprises:

when it is required to analyze a falling edge of the primary waveform, dividing a quantity of the third bit combinations by two; and performing the signal analysis on the third bit combinations with the quantity divided by two, so as to obtain the signal time margin.

\* \* \* \* \*